(12) United States Patent
Kinoshita et al.

(10) Patent No.: US 12,057,886 B2
(45) Date of Patent: Aug. 6, 2024

(54) OPTICAL TRANSCEIVER

(71) Applicant: TOKYO INSTITUTE OF TECHNOLOGY, Tokyo (JP)

(72) Inventors: Susumu Kinoshita, Tokyo (JP); Fumio Koyama, Tokyo (JP); Xiaodong Gu, Tokyo (JP)

(73) Assignee: TOKYO INSTITUTE OF TECHNOLOGY, Tokyo (JP)

( * ) Notice: Subject to any disclaimer, the term of this patent is extended or adjusted under 35 U.S.C. 154(b) by 71 days.

(21) Appl. No.: 17/927,514

(22) PCT Filed: May 13, 2021

(86) PCT No.: PCT/JP2021/018199
§ 371 (c)(1),
(2) Date: Nov. 23, 2022

(87) PCT Pub. No.: WO2021/241247
PCT Pub. Date: Dec. 2, 2021

(65) Prior Publication Data
US 2023/0246714 A1 Aug. 3, 2023

(30) Foreign Application Priority Data
May 27, 2020 (JP) .................................. 2020-092634

(51) Int. Cl.
*H04B 10/40* (2013.01)
*G02B 6/42* (2006.01)
(Continued)

(52) U.S. Cl.
CPC .......... *H04B 10/40* (2013.01); *G02B 6/4246* (2013.01); *H04B 10/25891* (2020.05); *H04B 10/503* (2013.01)

(58) Field of Classification Search
None
See application file for complete search history.

(56) References Cited

U.S. PATENT DOCUMENTS

| | | | |
|---|---|---|---|
| 5,633,962 A * | 5/1997 | Kurata ................. | G02B 6/4246 398/139 |
| 2004/0252945 A1 | 12/2004 | Kim et al. | |
| 2013/0230327 A1* | 9/2013 | Shin ..................... | G02B 6/4246 398/79 |

FOREIGN PATENT DOCUMENTS

| | | |
|---|---|---|
| JP | S54120948 U | 8/1979 |
| JP | H07168038 A | 7/1995 |

(Continued)

OTHER PUBLICATIONS

Jerabek et al., "Design and Construction of a VHGT-Attached WDM-Type Triplex Transceiver Module Using Polymer PLC Hybrid Integration Technology", The International Society for Optical Engineering, May 2008; 6 pages.
(Continued)

*Primary Examiner* — David W Lambert
(74) *Attorney, Agent, or Firm* — CANTOR COLBURN LLP

(57) ABSTRACT

An optical transceiver supports bidirectional communication with another optical transceiver that is a communications partner via a single-mode optical fiber. A surface emitting laser has a T-band oscillation wavelength that is shorter than the cutoff wavelength of the optical fiber. A photodetector has detection sensitivity with respect to the T band. A planar lightwave circuit couples the optical fiber, the surface emitting laser, and the photodetector.

17 Claims, 14 Drawing Sheets

(51) Int. Cl.
    *H04B 10/25* (2013.01)
    *H04B 10/50* (2013.01)

(56) References Cited

FOREIGN PATENT DOCUMENTS

| | | |
|---|---|---|
| JP | H1152158 A | 2/1999 |
| JP | 2000206349 A | 7/2000 |
| JP | 2004226430 A | 8/2004 |
| JP | 2013034134 A | 2/2013 |
| JP | 2013152272 A | 8/2013 |
| JP | 2013544374 A | 12/2013 |
| JP | 2017112519 A | 6/2017 |
| JP | 2018066962 A | 4/2018 |
| JP | 2018197849 A | 12/2018 |

OTHER PUBLICATIONS

International Search Report for International Application No. PCT/JP2021/018199; Mailing Date of Jul. 27, 2021.
PCT International Preliminary Report on Patentability for International Application No. PCT/JP2021/018199; Issued on Jan. 5, 2022.
PCT Written Opinion of the International Searching Authority for International Application No. PCT/JP2021/018199; Date of Mailing, Jul. 27, 2021.
Tsuda, "A large capacity optical router using the new communication wavelength band "T band"", Optical Alliance, Japan Industrial Publishing Co., Ltd.; vol. 31, No. 4, Apr. 1, 2020; IPRP serves as concise explanation of the relevance.
JPO Notification of Reason(s) for Refusal for corresponding JP Application No. 2020-092634; Dated Apr. 2, 2024; 6 pages.

\* cited by examiner

OPTICAL TRANSCEIVER

CROSS REFERENCE TO RELATED APPLICATIONS

This is the U.S. national stage of application No. PCT/JP2021/018199, filed on May 13, 2021. Priority under 35 U.S.C. § 119(a) and 35 U.S.C. § 365(b) is claimed from Japanese Application No. 2020-092634, filed May 27, 2020, the disclosure of which is also incorporated herein by reference.

BACKGROUND

1. Technical Field

The present disclosure relates to a bidirectional optical transmission system.

2. Description of the Related Art

Typical bidirectional optical transmission systems employed in fourth-generation (4G) mobile network infrastructure are structured based on a single-mode optical fiber formed of a silica-glass material having a zero-dispersion wavelength of 1.3 μm. Such an optical fiber ensures single-mode transmission in the 1.3 μm band or 1.5 μm band. Accordingly, an optical transceiver employed in the current optical transmission systems is structured using an edge-emitting laser with a C band, L band, or E band in the vicinity of 1.5 μm as the oscillation wavelength.

Currently, mobile networks are in the transitional period from the fourth generation (4G) to the fifth generation (5G), and high-speed optical transceivers are required for wireless access systems and data centers.

SUMMARY

The present disclosure has been made in view of such a situation.

Description will be made regarding the outline of several exemplary embodiments of the present disclosure. The outline is a simplified explanation regarding several concepts of one or multiple embodiments as a prelude to the detailed description described later in order to provide a basic understanding of the embodiments. That is to say, the outline described below is by no means intended to restrict the scope of the present invention and the present disclosure. Furthermore, the outline described below is by no means a comprehensive outline of all the possible embodiments. That is to say, the outline described below by no means restricts essential components of the embodiments. For convenience, in some cases, an "embodiment" as used in the present specification represents a single or multiple embodiments (examples and modifications) disclosed in the present specification.

An optical transceiver according to one embodiment is an optical transceiver structured to be capable of providing bidirectional communication with another optical transceiver that is a communications partner via a single-mode optical fiber. The optical transceiver includes: a surface emitting laser employed as a transmitter having a T-band (1.1 μm to 1.2 μm) oscillation wavelength that is shorter than the cutoff wavelength of the optical fiber; a photodetector employed as a receiver having a detection sensitivity with respect to the T band; and a planar lightwave circuit structured to couple the optical fiber to the surface emitting laser and the photodetector.

With this configuration employing a VCSEL having improved characteristics such as high-speed modulation, temperature stability, power consumption, etc., as compared with an edge emitting laser, this allows the optical transceiver to have improved characteristics. Such a surface emitting laser has very low power consumption as compared with an edge emitting laser, i.e., power consumption that is on the order of approximately ¹/₁₀ that of an edge emitting laser. This allows a cooling mechanism to be simplified or omitted, thereby contributing to providing the optical transceiver with a low cost and a compact size.

Also, as the optical fiber, a silica-glass based optical fiber that is already widely used is employed. That is to say, there is no need to introduce a new optical fiber that ensures single-mode transmission in the T band. This is capable of suppressing an increase in cost.

The optical fiber has a circular cross-section. A light signal having a fundamental mode (LP01) and a higher-order mode (LP11) is transmitted via the optical fiber. With this, even if only the fundamental mode (LP01) of the light signal is transmitted via the optical fiber from the optical transceiver, the conversion into higher-order modes happens in the stressed optical fiber or in a core-offset connector. The planar lightwave circuit which is often within the optical transceiver has a rectangular cross-section. In this case, the fundamental mode is TEM00, and the higher-order modes are TEM01 and TEM10. In both the optical fiber and the planar lightwave circuit, the electric field distribution of the fundamental mode has a unimodal shape. Accordingly, mode conversion between LP01 and TEM00 most readily occurs. T-band transmission, which does not ensure single-mode transmission, is performed via a silica-glass based optical fiber. Accordingly, the higher-order mode LP11 in the optical fiber readily changes to the higher-order mode TEM01 or TEM10 in the planar lightwave circuit. Accordingly, such an arrangement has the potential to cause a situation in which the reception light signal including the higher-order modes (TEM01, TEM10) is input to the optical transceiver in addition to the fundamental mode (TEM00). There is a difference in the propagation delay between the fundamental mode and the higher-order modes in the optical fiber. Accordingly, in a case in which a mixture thereof is input to the photodetector, this can become a cause of waveform distortion. In order to solve such a problem, the planar lightwave circuit may include a mode filter structured to remove a higher-order mode from a reception light signal input via the optical fiber, and to supply the received light signal to the photodetector. This is capable of suppressing waveform distortion, thereby enabling high-speed communication.

Also, the optical transceiver may not include an optical isolator structured to remove return light to the surface emitting laser. The surface emitting laser can be designed as a device having improved tolerance with respect to return light. Accordingly, by employing such a surface emitting laser, this allows an isolator to be omitted. This is capable of providing the optical transceiver with a low cost and/or a compact size.

With a conventional optical transceiver, this requires an isolator arranged on the output face of the edge emitting laser. Accordingly, such a conventional optical transceiver is configured as a free-space optical system. In contrast, with one embodiment, such an isolator is not required. Accordingly, this allows the optical transceiver to be configured as an integrated optical system instead of a free-space optical system.

Also, an output face of the surface emitting laser may be attached to an edge of the planar lightwave circuit. However, a conventional optical transceiver requires a large heatsink or isolator for an edge emitting laser. Accordingly, there is no room to apply an attaching technique. In contrast, by employing the surface emitting laser, this enables high-density mounting using an attaching technique. This allows the optical transceiver to have a compact size.

In one embodiment, the optical fiber may be structured as a single-mode fiber. In this case, the transmission wavelength that is the oscillation wavelength of the surface emitting laser may be longer than the reception wavelength of the reception light signal input via the optical fiber. The planar lightwave circuit may include: a first path having one end coupled to the optical fiber; and a second path having one end coupled to the surface emitting laser. Also, the optical transceiver may further include a low-pass filter having a first face coupled to the other end of the first path and the other end of the second path, having a second face on which the photodetector is arranged, and structured to transmit the reception wavelength, and to reflect the transmission wavelength. This configuration requires no directional coupler, thereby allowing the optical transceiver to be configured to involve low light loss.

In one embodiment, the optical fiber may be structured as a single-mode fiber. The transmission wavelength that is the oscillation wavelength of the surface emitting laser may be shorter than the reception wavelength of the reception light signal input via the optical fiber. The planar lightwave circuit may include: a first path having one end coupled to the optical fiber; and a second path having one end coupled to the surface emitting laser. The optical transceiver may further include a high-pass filter having a first face coupled to the other end of the first path and the other end of the second path, having a second face on which the photodetector is arranged, and structured to transmit the reception wavelength, and to reflect the transmission wavelength. This configuration requires no directional coupler, thereby allowing the optical transceiver to be configured to involve low light loss.

In one embodiment, the optical transceiver may include a forward monitor element structured to detect the output intensity of the surface emitting laser. A part of light guided via the second path may be supplied to the forward monitor element. This allows the output intensity of the surface emitting laser to be feedback controlled.

In one embodiment, the optical fiber may be configured as a pair of single-mode fibers. The planar lightwave circuit may include: a first path having one end coupled to a first core of the pair of single-mode fibers and the other end coupled to the photodetector; and a second path having one end coupled to a second core of the pair of single-mode fibers and the other end coupled to the surface emitting laser. This configuration requires no directional coupler, thereby allowing the optical transceiver to be configured to involve low light loss.

Also, the first path may have a function as a mode filter for removing a higher-order mode of the reception light signal. This is capable of suppressing waveform distortion, thereby enabling high-speed communication.

Also, the first path may have a radius of curvature designed so as to remove the higher-order mode of the reception light signal. With this, the first path is configured to have a function as a mode filter for removing higher-order modes.

Also, the second path may have a function as a mode filter for removing a higher-order mode of the transmission light signal. This is capable of suppressing higher-order modes coupling with the optical fiber on the transmission side.

Also, the second path may have a radius of curvature designed so as to remove the higher-order mode of the transmission light signal. With this, the second path is configured to have a function as a mode filter for removing higher-order modes.

Also, the optical fiber may be configured as a single-mode fiber. Also, the oscillation wavelength of the surface emitting laser may be equal to the wavelength of the reception light signal input via the optical fiber. The planar lightwave circuit may include a four-port directional coupler. Also, the optical fiber may be coupled to one from among two ports on the primary side of the directional coupler. Also, the photodetector and the surface emitting laser may be coupled to two ports of the secondary side of the directional coupler. This configuration causes light loss due to the directional coupler. However, this configuration has an advantage of requiring no optical filter.

Also, the optical transceiver may further include a forward monitor element coupled to the other of the two ports on the primary side of the directional coupler and structured to detect the output intensity of the surface emitting laser.

Also, the directional coupler may have a function as a mode filter for removing a higher-order mode of the reception light signal, and to supply a fundamental mode of the reception light signal to the photodetector. By optimizing the length of the directional coupler, this allows the fundamental mode component to be transmitted, and is capable removing the higher-order modes.

It should be noted that any combination of the components described above or manifestation of the present disclosure may be mutually substituted between a method, apparatus, and so forth, which are also effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Figure 1:
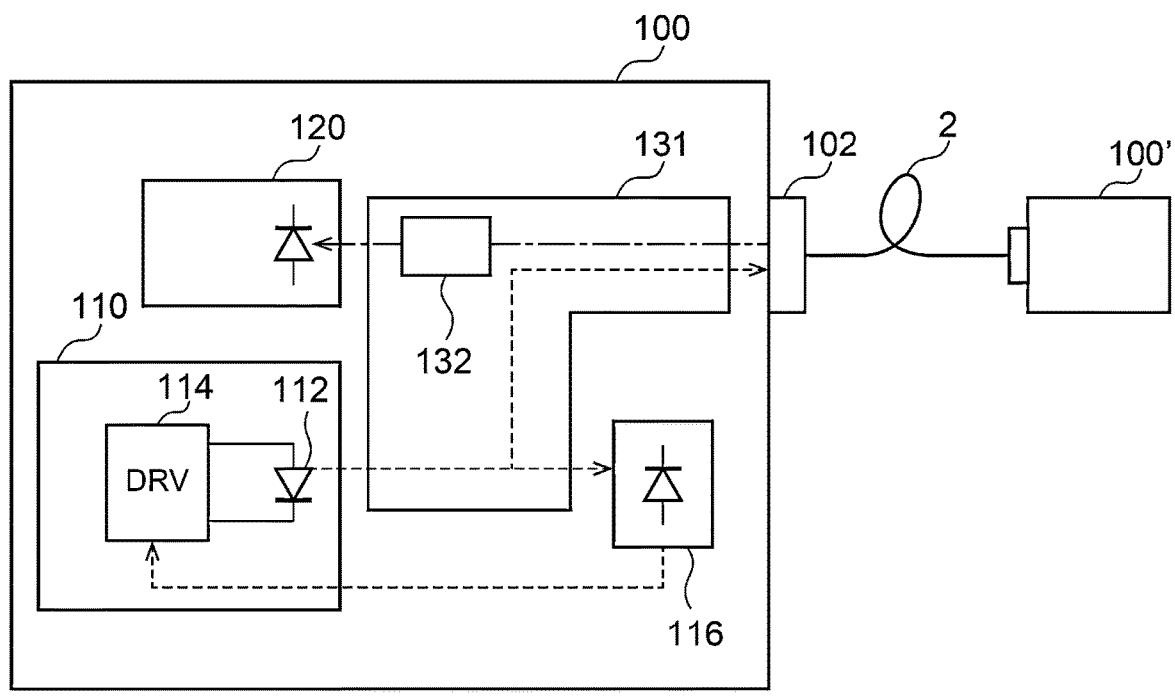
FIG. 1 is a diagram showing a basic configuration of an optical transceiver according to an embodiment.

Description will be made below regarding preferred embodiments with reference to the drawings. The same or similar elements, components, and processes are denoted by the same reference numerals, and redundant description thereof will be omitted as appropriate. The embodiments have been described for exemplary purposes only and are by no means intended to restrict the present invention. Also, it is not necessarily essential for the present invention that all the features or a combination thereof be provided as described in the embodiments.

FIG. 1 is a diagram showing a basic configuration of an optical transceiver 100 according to an embodiment. The optical transceiver 100 supports bidirectional communication with an optical transceiver 100' which is a communications partner via a single-mode optical fiber 2. The optical transceivers 100 and 100' have substantially the same configuration. As the optical fiber 2, a widely used silica glass-based single-mode fiber is employed. The optical fiber 2 ensures single-mode transmission in a wavelength band that is longer than the cutoff wavelength λc.

The optical transceiver 100 includes an optical adapter 102, a transmitter 110, a receiver 120, a planar lightwave circuit (PLC) 131, and a forward monitor element 116.

The optical transceiver 100 is coupled to the optical fiber 2 via the optical adapter 102.

The transmitter 110 includes a surface emitting laser 112 and a driver 114. The transmitter 110 may be configured as a module, i.e., a transmitter optical sub-assembly (TOSA).

The surface emitting laser 112 to be employed as a transmitter is configured as a VCSEL having an oscillation wavelength in the T band (1.1 to 1.2 μm) that is shorter than the cutoff wavelength λc of the optical fiber 2. Accordingly, the light signal received from the partner-side optical transceiver 100' also has a wavelength in the T band. The driver 114 drives the surface emitting laser 112 according to the transmission data so as to generate a modulated transmission light signal.

The receiver 120 includes a photodetector 122. The photodetector 122 is configured as a PIN photodiode or an avalanche photodiode (APD) having detection sensitivity in the T band. The photodetector 122 detects a light signal received via the optical fiber 2. In addition to the photodetector 122, the receiver 120 may include a transimpedance amplifier (TIA) 124 configured to convert a current that flows through the photodetector 122 into a voltage signal. Such an arrangement may be configured as a module, i.e., a receiver optical sub-assembly (ROSA).

The planar lightwave circuit 131 couples the optical fiber 2, the surface emitting laser 112, and the photodetector 122. Specifically, the planar lightwave circuit 131 supplies the output light of the surface emitting laser 112 to the optical adapter 102 as a transmission light signal. Furthermore, the planar lightwave circuit 131 supplies the reception light signal input to the optical adapter 102 to the photodetector 122.

The forward monitor element 116 is provided in order to detect the output intensity of the surface emitting laser 112. The planar lightwave circuit 131 supplies a part of the output light of the surface emitting laser 112 to the forward monitor element 116. The driver 114 of the transmitter 110 control the driving current to be supplied to the surface emitting laser 112 by feedback control according to the output of the forward monitor element 116. In a case of employing an edge emitting laser, the output intensity can be monitored at an edge opposite to the output edge. However, in a case of employing a surface emitting laser, the output intensity cannot be monitored on the back face (substrate) side. In order to solve such a problem, by providing the monitor element 116, this allows the output to be stabilized.

The above is the basic configuration of the optical transceiver 100. With this configuration employing a VCSEL having improved characteristics such as temperature stability, power consumption, etc., as compared with an edge emitting laser, this allows the optical transceiver to have improved characteristics. Such a surface emitting laser has very low power consumption as compared with an edge emitting laser, i.e., power consumption that is on the order of approximately 1/10 that of an edge emitting laser. This allows a cooling mechanism to be simplified or omitted, thereby contributing to providing the optical transceiver with a low cost and a compact size.

Also, as the optical fiber 2, a silica-glass based optical fiber that is already widely used is employed. That is to say, there is no need to introduce a new optical fiber that ensures single-mode transmission in the T band. This is capable of suppressing an increase in cost.

An edge emitting laser is capable of generating only a beam having an elliptical cross-section. Accordingly, in order to couple such an edge emitting laser to the optical fiber 2, an optical lens system is required. In contrast, with a surface emitting laser having an output aperture that is circular, this is capable of generating a beam having a circular cross-section. Accordingly, the output light can be coupled to the optical fiber 2 without an optical lens. This allows the optical transceiver 100 to be provided with a reduced cost and a compact size.

A further feature of the optical transceiver 100 is that an isolator is not required to remove return light to the surface emitting laser 112. The surface emitting laser 112 can be designed as a device having improved tolerance with respect to return light. Accordingly, by employing such a surface emitting laser, an isolator can be omitted. This allows the optical transceiver to be provided with a low cost and a compact size.

Furthermore, with a conventional optical transceiver that requires an isolator to be arranged on the output face of the edge emitting laser, this involves a space restriction. Accordingly, such a conventional optical transceiver is configured as a free-space optical system. In contrast, with the present embodiment, such an isolator is not required. Accordingly, this allows the optical transceiver to be configured as an integrated optical system using the planar lightwave circuit 131. Detailed description of this point will be made later in the following embodiments 1 through 3.

As shown in FIG. 1, the planar lightwave circuit 131 is preferably provided with a mode filter 132. The mode filter 132 removes higher-order modes (TEM01, TEM10) from the reception light signal input via the optical fiber 2 and supplies the fundamental mode (TEM00) to the photodetector 122.

It should be noted that, in the present embodiment, the T band, which does not ensure single-mode transmission, is transmitted via the optical fiber 2. Accordingly, in addition to the fundamental mode (TEM00), such an arrangement has the potential to receive a light signal including higher-order modes (TEM01, TEM10). There is a difference in the propagation delay between the fundamental mode and the higher-order modes. Accordingly, in a case in which a mixture of the fundamental mode and the higher-order modes is input to the photodetector 122, this becomes a cause of waveform distortion, leading to degradation of the transmission rate. In order to solve such a problem, by providing the planar lightwave circuit 131 with the mode filter 132, this is capable of suppressing waveform distortion, thereby enabling high-speed communication.

The present invention encompasses various kinds of apparatuses and methods that can be regarded as a block configuration shown in FIG. 1, or otherwise that can be derived from the aforementioned description. That is to say, the present invention is not restricted to a specific configuration. More specific description will be made below regarding an example configuration or an example for clarification and ease of understanding of the essence of the present invention and the operation thereof. That is to say, the following description will by no means be intended to restrict the technical scope of the present invention.

Example 1

Figure 2A:
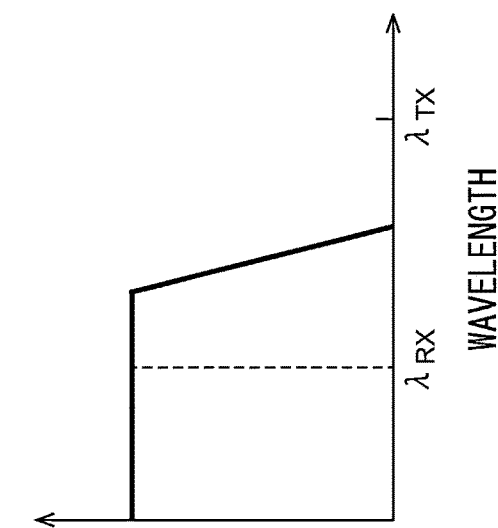
FIG. 2A is a diagram showing an optical transceiver according to an example 1.

FIG. 2A is a diagram showing an optical transceiver 100A according to an example 1. In the example 1, the optical fiber 2 is configured as a single-mode fiber. Furthermore, the transmission wavelength $\lambda_{TX}$, which is an oscillation wavelength of the surface emitting laser 112, is longer than the reception wavelength $\lambda_{RX}$ to be input via the optical fiber 2. It should be noted that, in another optical transceiver 100B, which is to communicate with the optical transceiver 100A, the wavelength relation is the inverse.

A first path 134 and a second path 136 are formed on the planar lightwave circuit 131. One end e1 of the first path 134 is coupled to the optical fiber 2 via the optical adapter 102. Furthermore, one end e1 of the second path 136 is coupled to the surface emitting laser 112.

Figure 2B:
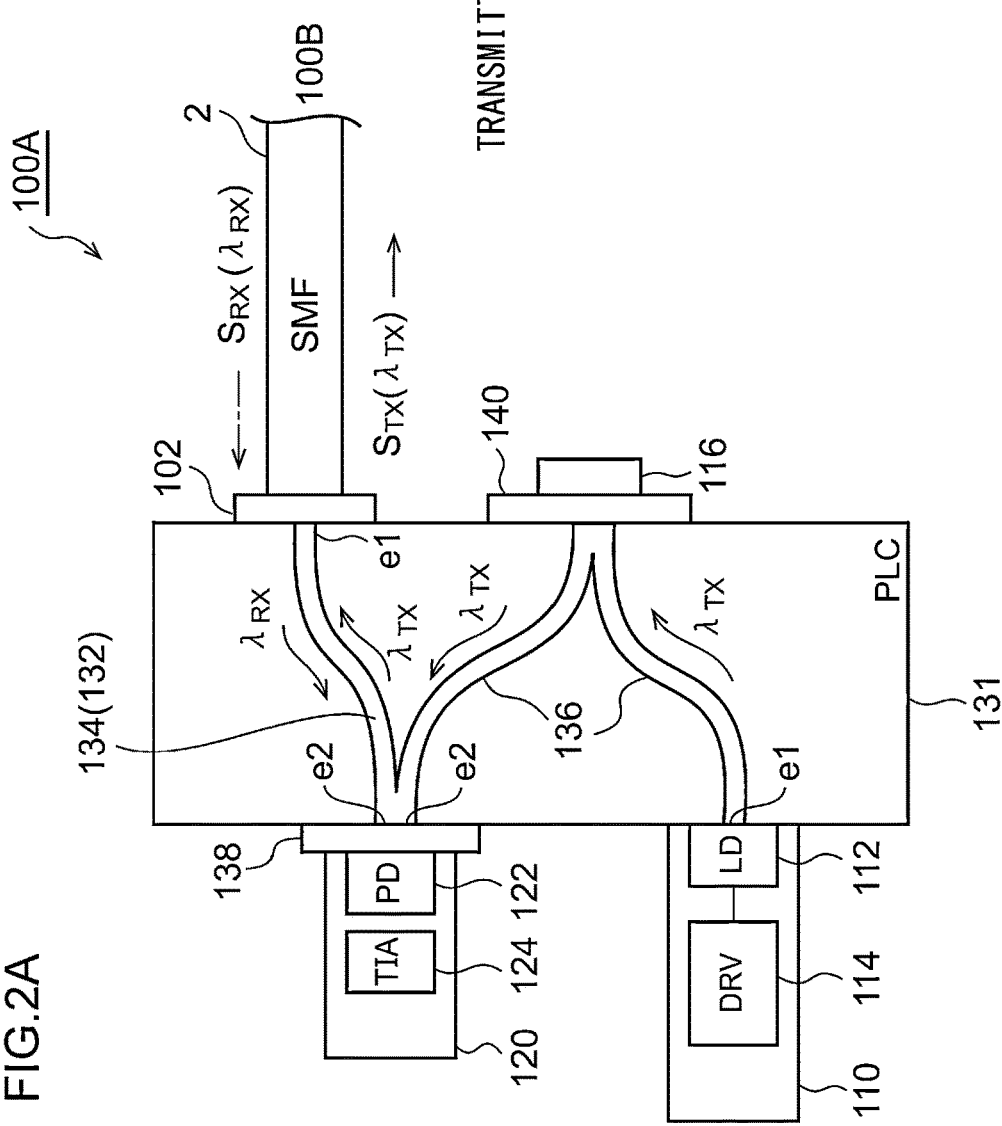
FIG. 2B is a diagram showing transmission characteristics of a low-pass filter.

The optical transceiver 100A is further provided with a low-pass filter 138 attached to an edge of the planar lightwave circuit 131. A first face f1 of the low-pass filter 138 is coupled to the other end e2 of the first path 134 and the other end e2 of the second path 136. The photodetector 122 is arranged on the second face f2 of the low-pass filter 138. The low-pass filter 138 transmits the reception wavelength $\lambda_{RX}$, and reflects the transmission wavelength $\lambda_{TX}$. FIG. 2B is a diagram showing the transmission characteristics of the low-pass filter 138.

The second path 136 is formed such that it turns back at one side of the planar lightwave circuit 131. The optical transceiver 100A is further provided with a partial reflecting mirror 140 arranged at a point at which the second path 136 turns back. The partial reflecting mirror 140 is attached to the edge of the planar lightwave circuit 131 at the turning-back point of the second path 136. The forward monitor element 116 is arranged on the back side of the partial reflecting mirror 140. The partial reflecting mirror 140 reflects the greater part (e.g., 90%) of the output light of the surface emitting laser 112 such that it is supplied to the low-pass filter 138. Furthermore, the partial reflecting mirror 140 transmits a part (e.g., 10%) of the output light such that it is supplied to the forward monitor element 116.

The first path 134 preferably has a function as a mode filter (mode filter 132 shown in FIG. 1) for removing higher-order modes of the reception light signal $S_{RX}$. In order to provide such a function, the first path 134 is configured as a curved waveguide with a radius of curvature designed so as to remove the higher-order modes of both the reception light signal $S_{RX}$ and the transmission light signal $S_{TX}$.

Furthermore, the second path 136 preferably has a function as a mode filter for removing the higher-order modes of the transmission light signal $S_{TX}$. In order to provide such a function, the second path 136 is configured as a curved waveguide with a radius of curvature designed so as to remove the higher-order modes of the transmission light signal $S_{TX}$. If the first path 134 can sufficiently remove the higher-order modes of the transmission light signal $S_{TX}$, the second path 136 may not remove the higher-order modes of the transmission light signal $S_{TX}$.

Figure 3:
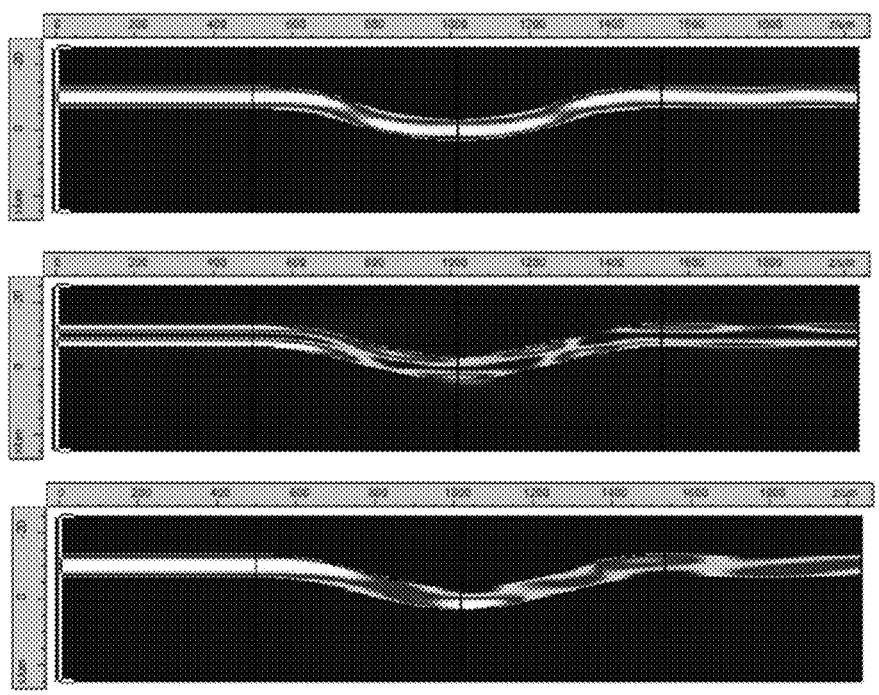
FIG. 3 is a diagram showing characteristics of a mode filter provided with an exemplary curved waveguide.

FIG. 3 is a diagram showing the characteristics of a mode filter provided with an exemplary curved waveguide. FIG. 3 is a diagram showing the curved waveguide as viewed from the top. Here, the gradation represents the light intensity. In the drawing, the left side corresponds to the input port of the curved waveguide, and the right side corresponds to the output port. The fundamental mode, i.e., TEM00, propagates with a loss of 0.1 dB. In contrast, the higher-order modes, i.e., TEM10 and TEM01, propagate with a loss of 4 dB. Accordingly, it can be understood that the curved waveguide has a function as a mode filter.

Figure 4:
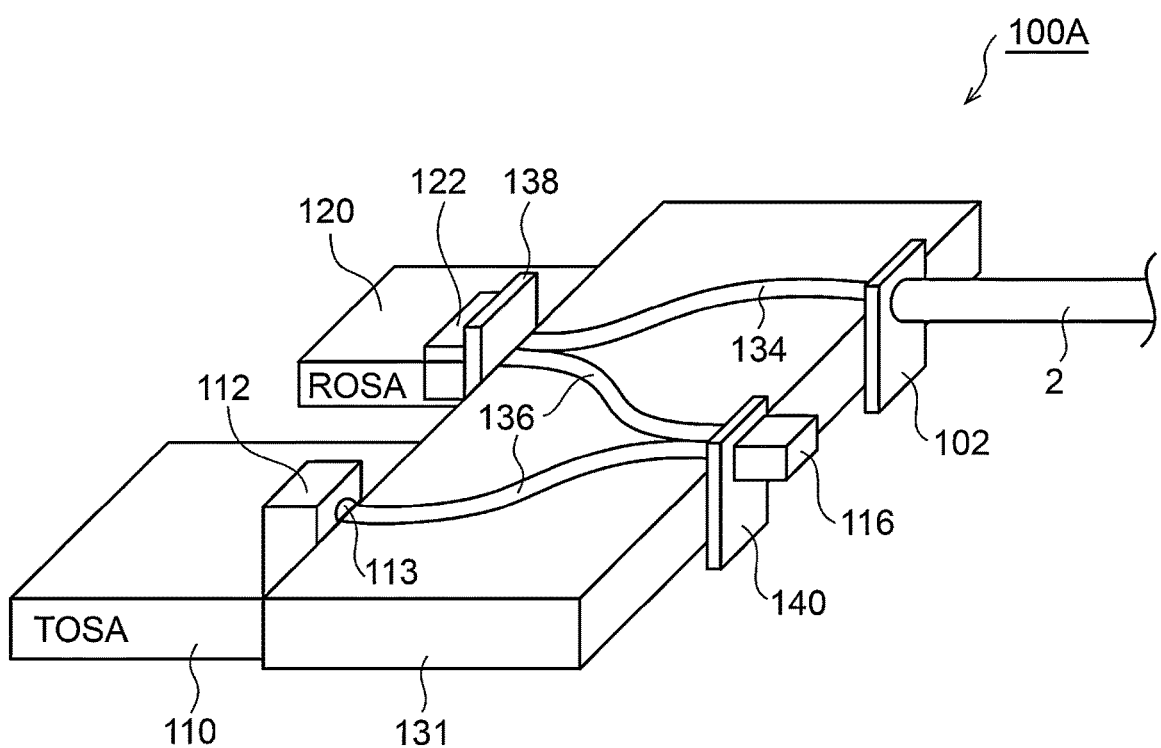
FIG. 4 is a perspective view of the optical transceiver shown in FIG. 2A and FIG. 2B.

FIG. 4 is a perspective view of the optical transceiver 100A shown in FIG. 2A and FIG. 2B. The surface emitting laser 112 is joined to an edge of the planar lightwave circuit 131 such that its output 113 is coupled to one end e1 of the second path 136. Furthermore, the low-pass filter 138 and the partial reflecting mirror 140 are each attached to an edge of the planar lightwave circuit 131. It should be noted that the path (waveguide) formed in the planar lightwave circuit 131 is not actually exposed on the surface of the substrate. Rather, the path (waveguide) is structured with a core and a cladding layer that surrounds the core.

A conventional optical transceiver requires a large heatsink or isolator for an edge emitting laser. Accordingly, there is no room to apply a mounting technique. In contrast, with the embodiment 1 employing the surface emitting laser, this enables high-density packaging using a mounting technique. This allows the optical transceiver 100A to have a compact size as compared with a free-space optical system.

Figure 5:
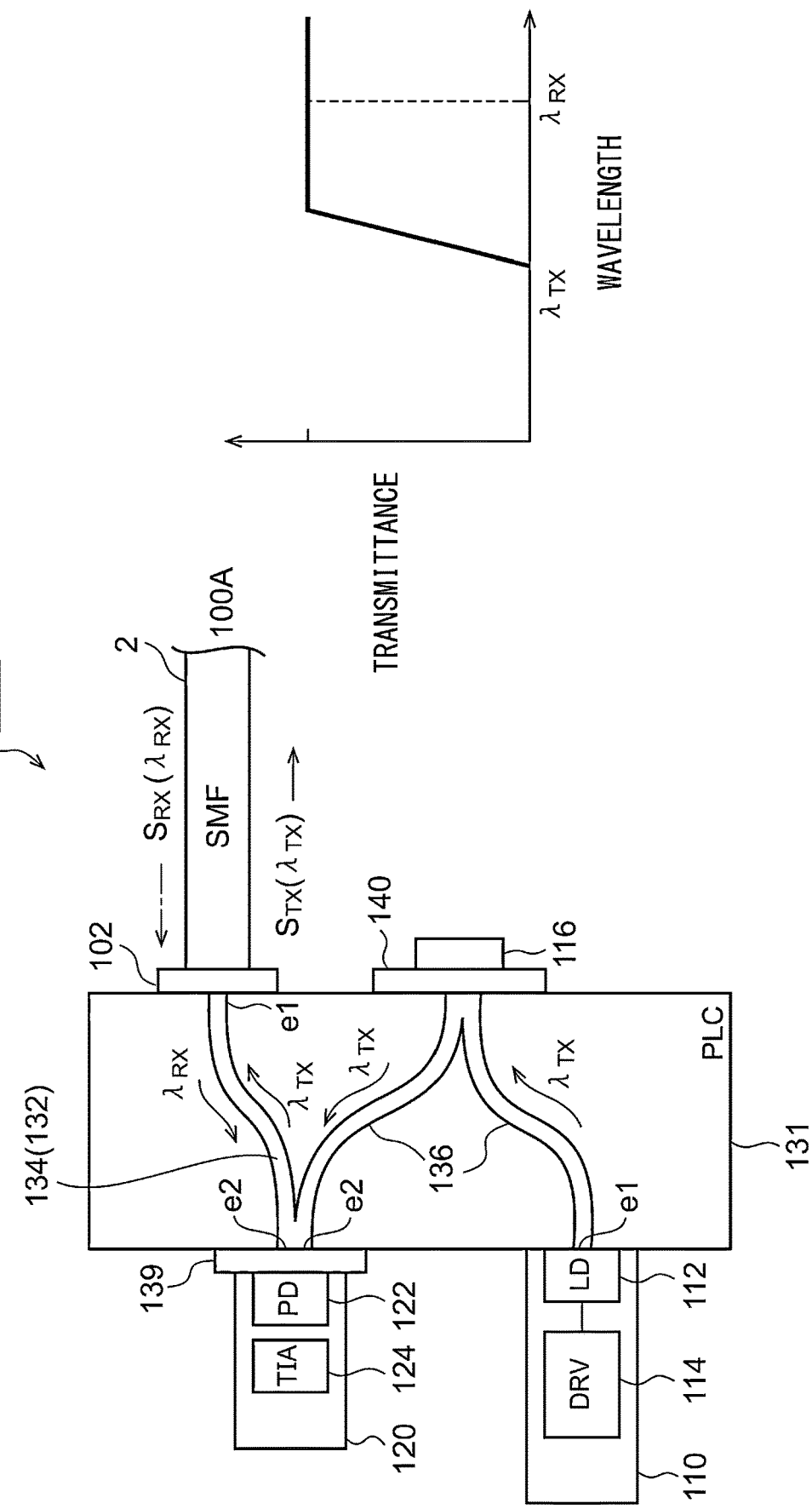
FIG. 5A is a diagram showing an optical transceiver according to the example 1.
FIG. 5B is a diagram showing transmission characteristics of a high-pass filter.

FIG. 5A is a diagram showing an optical transceiver 100B according to the example 1. The optical transceiver 100B supports bidirectional communication with the optical transceiver 100A shown in FIG. 2A. The surface emitting laser 112 oscillates with a transmission wavelength $\lambda_{TX}$ that is shorter than the reception wavelength $\lambda_{RX}$ of the reception light signal to be input via the optical fiber 2.

The optical transceiver 100B is provided with a high-pass filter 139 instead of the low-pass filter 138 shown in FIG. 2A. FIG. 5B is a diagram showing the transmission characteristics of the high-pass filter. The high-pass filter 139 transmits the reception wavelength $\lambda_{RX}$, and reflects the transmission wavelength $\lambda_{TX}$. The other configuration of the optical transceiver 100B is the same as that of the optical transceiver 100A.

Example 2

Figure 6:
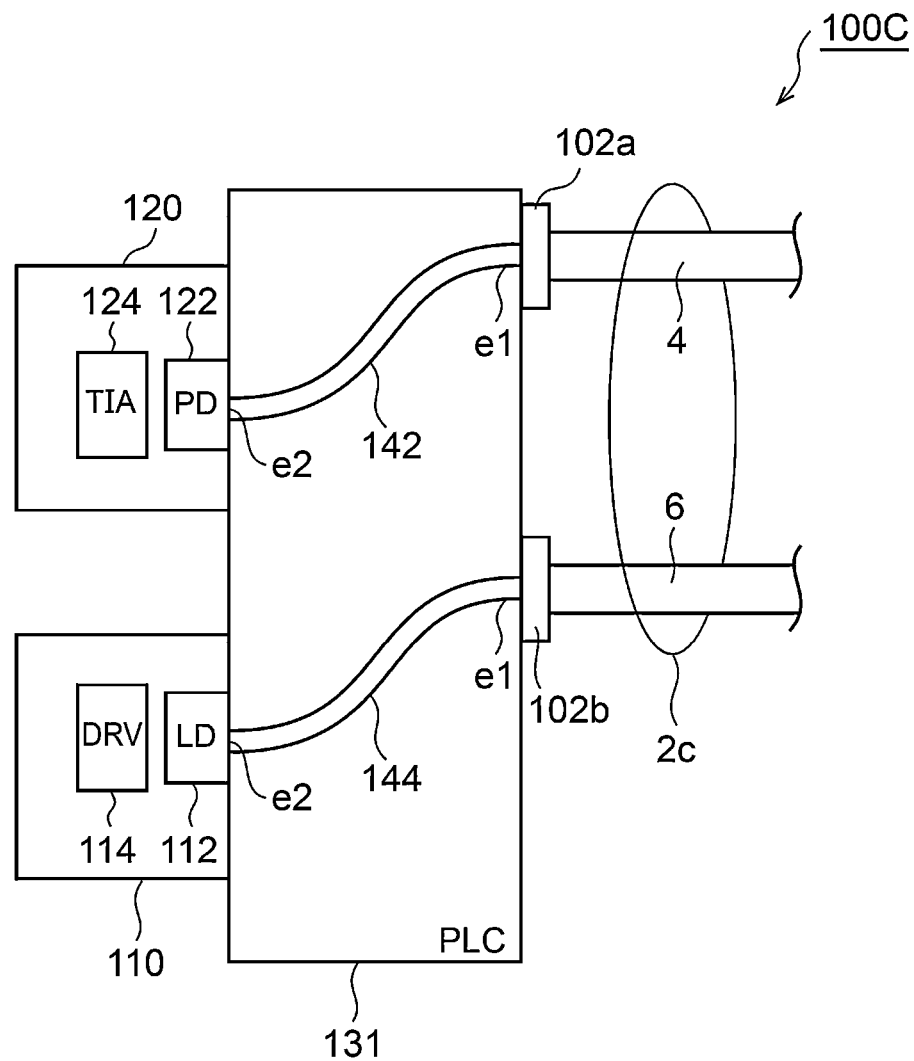
FIG. 6 is a diagram showing an optical transceiver according to an example 2.

FIG. 6 is a diagram showing an optical transceiver 100C according to an example 2. The optical transceiver 100C is coupled to another optical transceiver 100C' which is a communications partner, via a pair of single mode fibers 2C. The pair of single-mode fibers 2C include a first core 4 and a second core 6.

As with the example 1, a first path 142 and a second path 144 are formed in a planar lightwave circuit 131.

One end e1 of the first path 142 is coupled to the first core 4 of the pair of fibers 2C via the optical adapter 102a. The other end e2 thereof is coupled to the photodetector 122. One end e1 of the second path 144 is coupled to the second core 6 of the pair of single-mode fibers 2C via the optical connector 102b. The other end e2 thereof is coupled to the surface emitting laser 112.

As with the example 1, the first path 142 and the second path 144 are each preferably formed as a curved waveguide. This allows the first path 142 and the second path 144 to each have a function as a mode filter. Such an arrangement is capable of suppressing waveform distortion, thereby providing high-speed communication.

Figure 7:
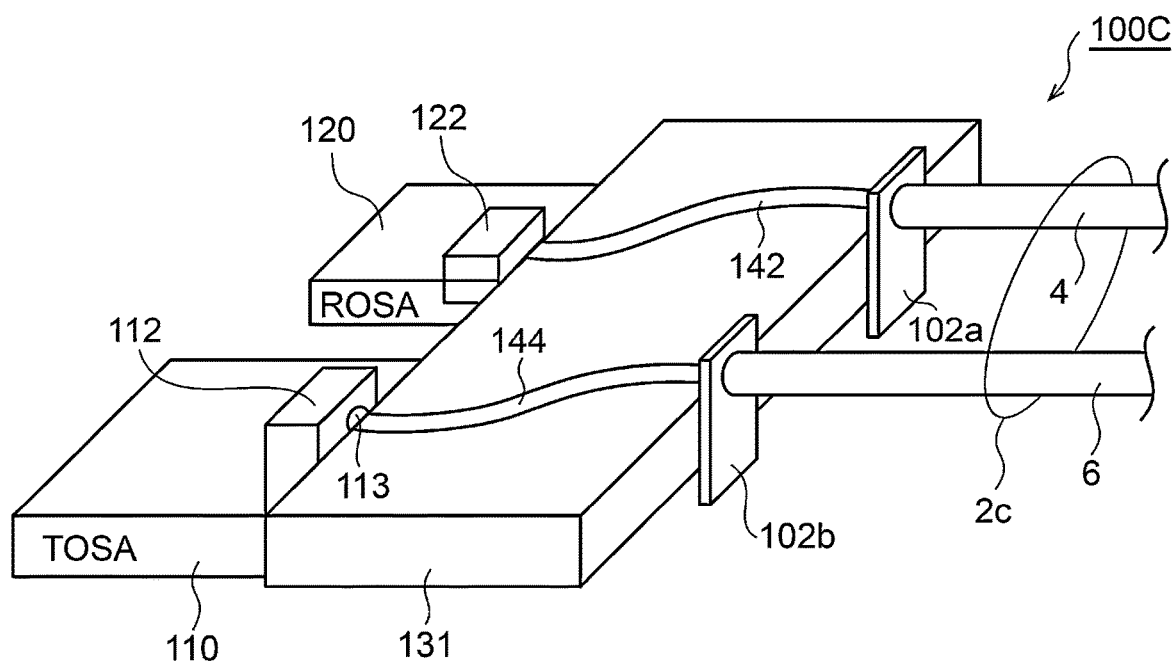
FIG. 7 is a perspective view of an optical transceiver shown in FIG. 6.

FIG. 7 is a perspective view of the optical transceiver 100C shown in FIG. 6. The surface emitting laser 112 is joined to an edge of the planar lightwave circuit 131 such that its output 113 is coupled to one end e1 of the second path 136. Furthermore, the photodetector 122 is attached to an edge of the planar lightwave circuit 131. This enables high-density packaging as in the example 1. This allows the optical transceiver 100C to be provided with a compact size as compared with a free-space optical system. In comparison with the example 1, such an arrangement does not require the low-pass filter 138, thereby allowing the size of optical transceiver 100C to be further reduced.

Example 3

Figure 8:
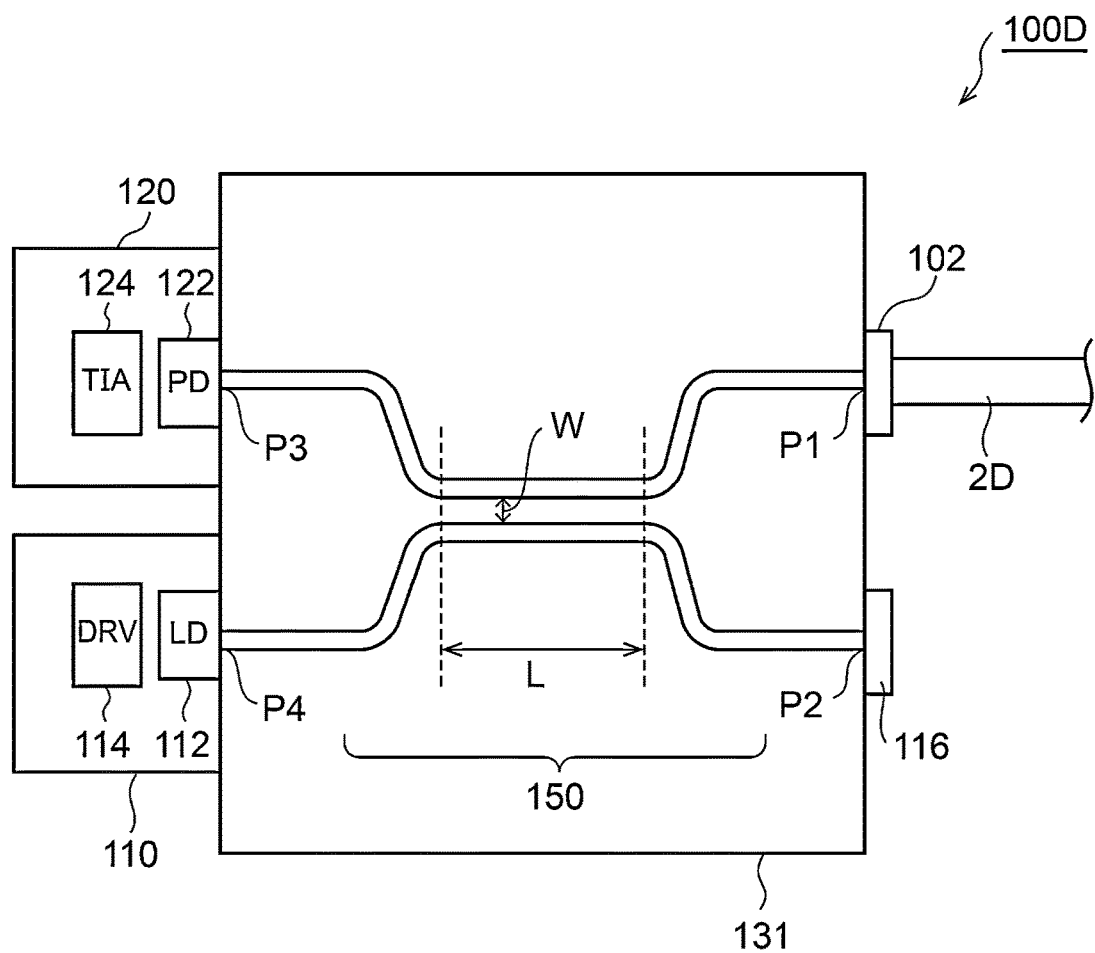
FIG. 8 is a diagram showing an optical transceiver according to an example 3.

FIG. 8 is a diagram showing an optical transceiver 100D according to an example 3. The optical transceiver 100D is coupled to another optical transceiver which is a communications partner via a single-mode fiber 2D.

In the example 3, both the oscillation wavelength (transmission wavelength $\lambda_{TX}$) of the surface emitting laser 112 and the wavelength $\lambda_{RX}$ of the reception light signal to be input via the optical fiber 2 are in the T band.

A four-port directional coupler 150 is formed in the planar lightwave circuit 131. An optical fiber 2D is coupled to a first port P1 on the primary side of the directional coupler 150 via the optical adapter 102. The photodetector 122 is coupled to one of the two ports, i.e., a port P3 on the secondary side of the directional coupler 150. The other port P4 of the secondary side thereof is coupled to the surface emitting laser 112. The other port P2 on the primary side of the directional coupler 150 is coupled to the forward monitor element 116.

As in the example 1 or 2, the directional coupler 150 can be formed in the planar circuit 131. The directional coupler 150 has a function as a mode filter. That is to say, the directional coupler 150 removes the higher-order modes of the reception light signal $S_{RX}$ and supplies the fundamental mode of the reception light signal $S_{RX}$ to the photodetector 122. That is to say, a function as a mode filter is provided between the first port P1 and the third port P3.

Figure 9:
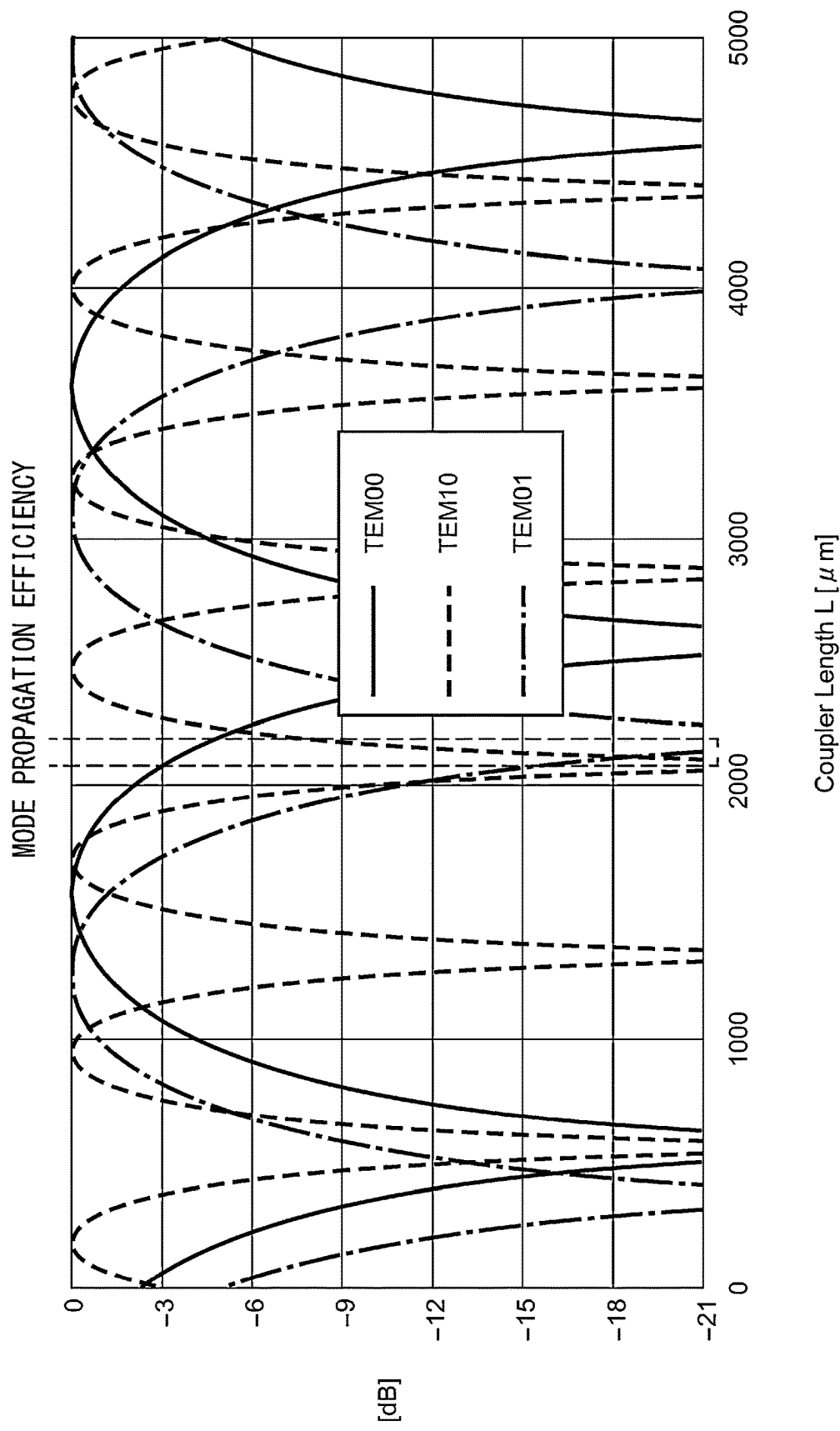
FIG. 9 is a diagram showing simulation results of characteristics of a directional coupler.

FIG. 9 is a diagram showing simulation results of the characteristics of the directional coupler 150. The horizontal axis represents the coupler length L, and the vertical axis represents the TEM00, TEM10, and TEM01 transmission efficiency. The planar lightwave circuit 131 is designed to have a typical refraction index difference Δn of 0.45%. Furthermore, the directional coupler 150 is designed with a wavelength of 1.1 μm, with a core having a (7 μm×7 μm) rectangular cross-section, and with a waveguide interval W of 1 μm.

As can be understood from the results shown in FIG. 9, in a case in which the coupler length L is designed to be 2.09 mm (=2,090 μm), the coupling coefficient for the fundamental mode is 3 dB. That is, the directional coupler 150 functions as a ½ splitter, and as a suppression filter for the higher-order modes.

Figure 10A:
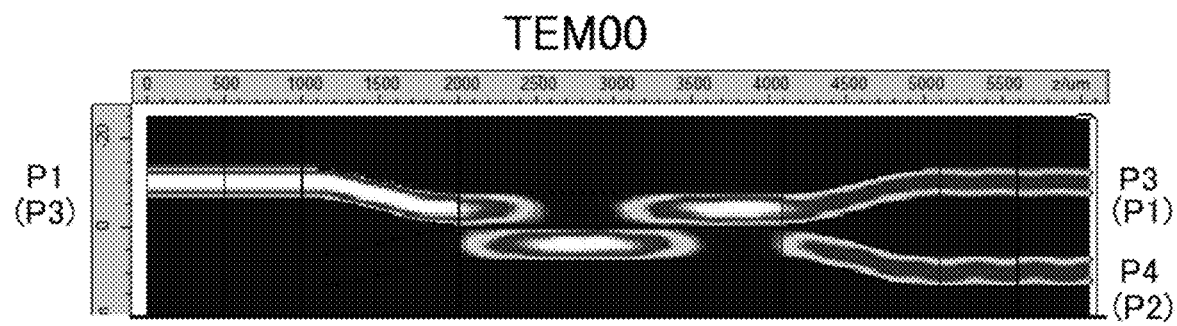
FIGS. 10A through 10C are diagrams each showing simulation results of the directional coupler.
Figure 10B:
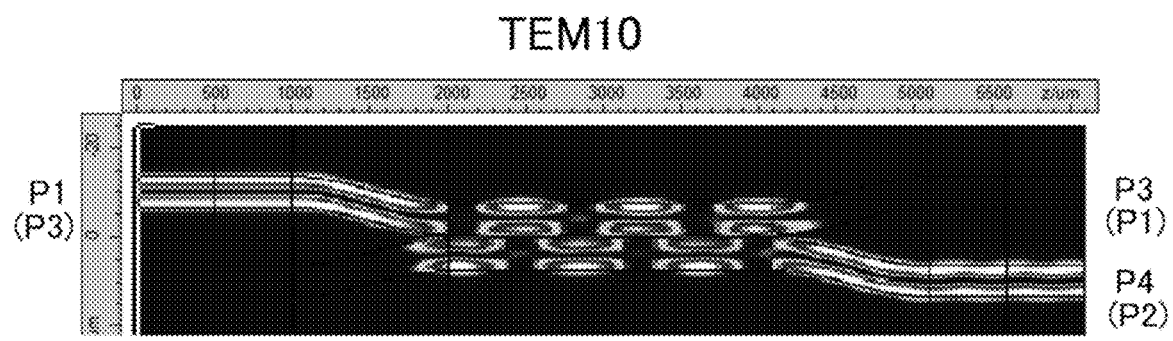
Figure 10C:
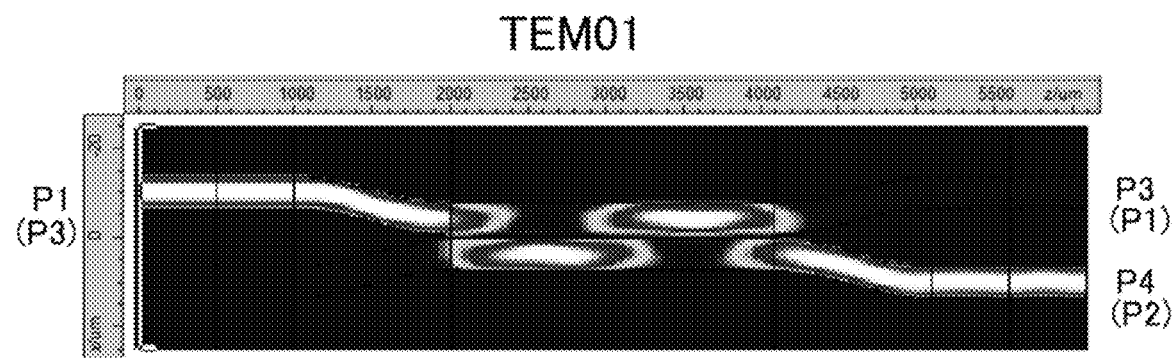

FIG. 10A through FIG. 10C are diagrams showing the simulation results of the directional coupler 150. The coupler length L is designed to be 2.09 mm. FIG. 10A through FIG. 10C show the intensity distribution when TEM00, TE10, and TEM01 are input to the port 1, respectively. The directional coupler has reversibility. Accordingly, in a case in which a signal is input to the P3 port, an upper output port corresponds to the port P1, and a lower output port corresponds to the port P2.

The directional coupler 150 exhibits attenuation rates of −3.12 dB and −2.94 dB at the ports P3 and P4 with respect to the fundamental mode TEM00. Accordingly, it can be confirmed that the directional coupler 150 functions as a ½ splitter.

The attenuation rates with respect to the higher-order mode TEM10 at the ports P3 and P4 are −33.8 dB and −0.09 dB, respectively. Accordingly, it can be confirmed that a function as a mode suppression filter is provided between the ports P1 and P3. Furthermore, the attenuation rates at the ports P3 and P4 with respect to the higher-order mode TEM01 are −15.5 dB and −0.13 dB, respectively. Accordingly, it can be confirmed that a function as a mode suppression filter is provided between the ports P1 and P3.

Figure 11:
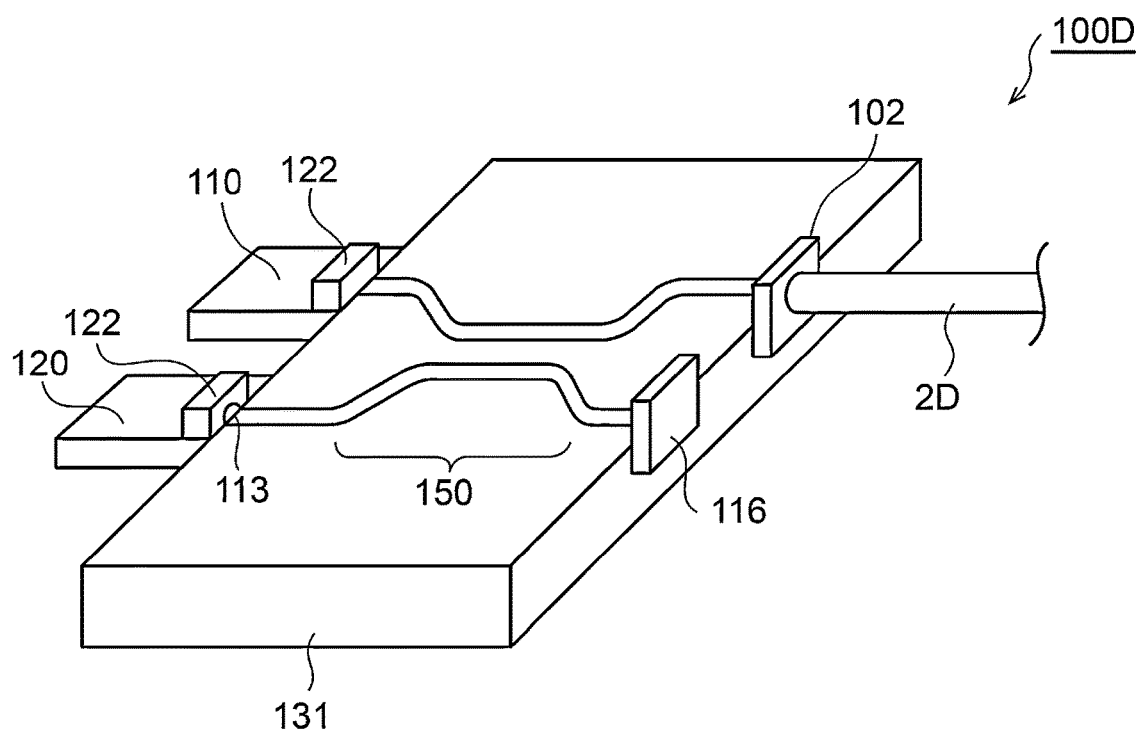
FIG. 11 is a perspective view of the optical transceiver shown in FIG. 8.

FIG. 11 is a perspective view of the optical transceiver 100D shown in FIG. 8. The surface emitting laser 112 is joined to an edge of the planar lightwave circuit 131 such that its output 113 is coupled to the first port of the directional coupler 150. Furthermore, the photodetector 122 and the forward monitor element 116 are each attached to an edge of the planar lightwave circuit 131. As in the example 1 or 2, this enables high-density packaging, thereby allowing the optical transceiver 100D to be provided with a compact size as compared with the free-space optical system.

Example 4

Figure 12:
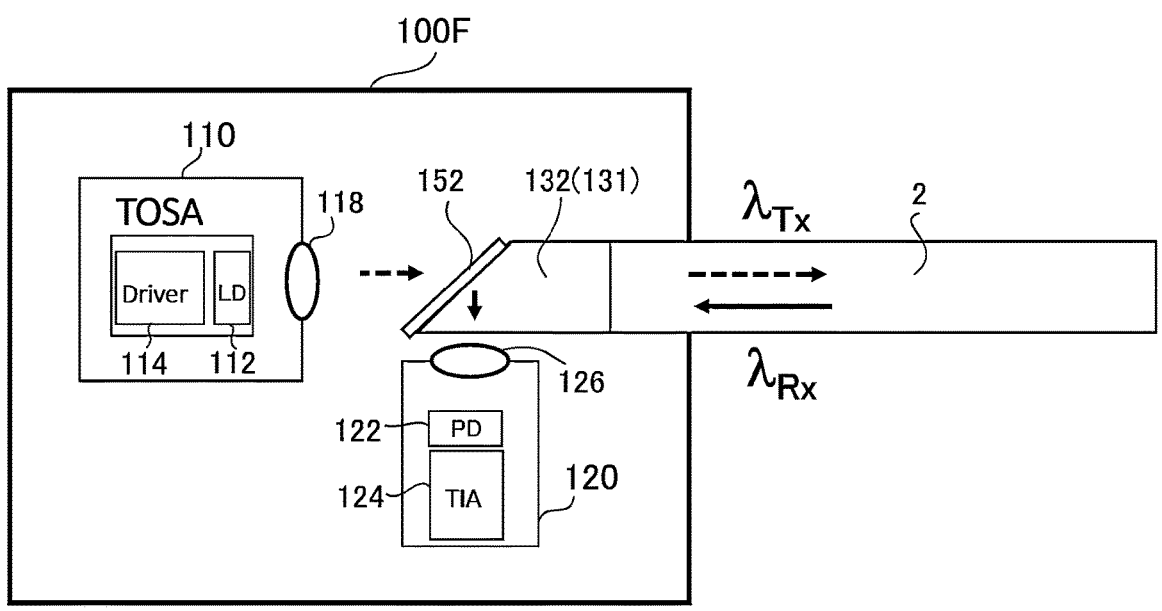
FIG. 12 is a diagram showing an optical transceiver according to an example 4.

FIG. 12 is a diagram showing an optical transceiver 100F according to an example 4. In the optical transceiver 100F, the surface emitting laser 112 and the optical fiber 2 are coupled by a free-space coupling system. The transmitter 110 is provided with a coupling lens 110. For example, the transmitter 110 is configured as a package referred to as a "TO-CAN". Furthermore, the receiver 120 is also configured as a TO-CAN package in which the photodetector 122 and the single-mode fiber 2 are coupled via a lens 126. A wavelength filter 152 reflects the reception wavelength $\lambda_{RX}$ and is transmissive for the transmission wavelength $\lambda_{TX}$. In a case in which $\lambda_{TX} > \lambda_{RX}$, the wavelength filter 152 is configured as a high-pass filter. In a case in which $\lambda_{TX} < \lambda_{RX}$, the wavelength filter 152 is configured as a low-pass filter. The mode filter 132 is mounted on the planar lightwave circuit 131.

Example 5

Figure 13:
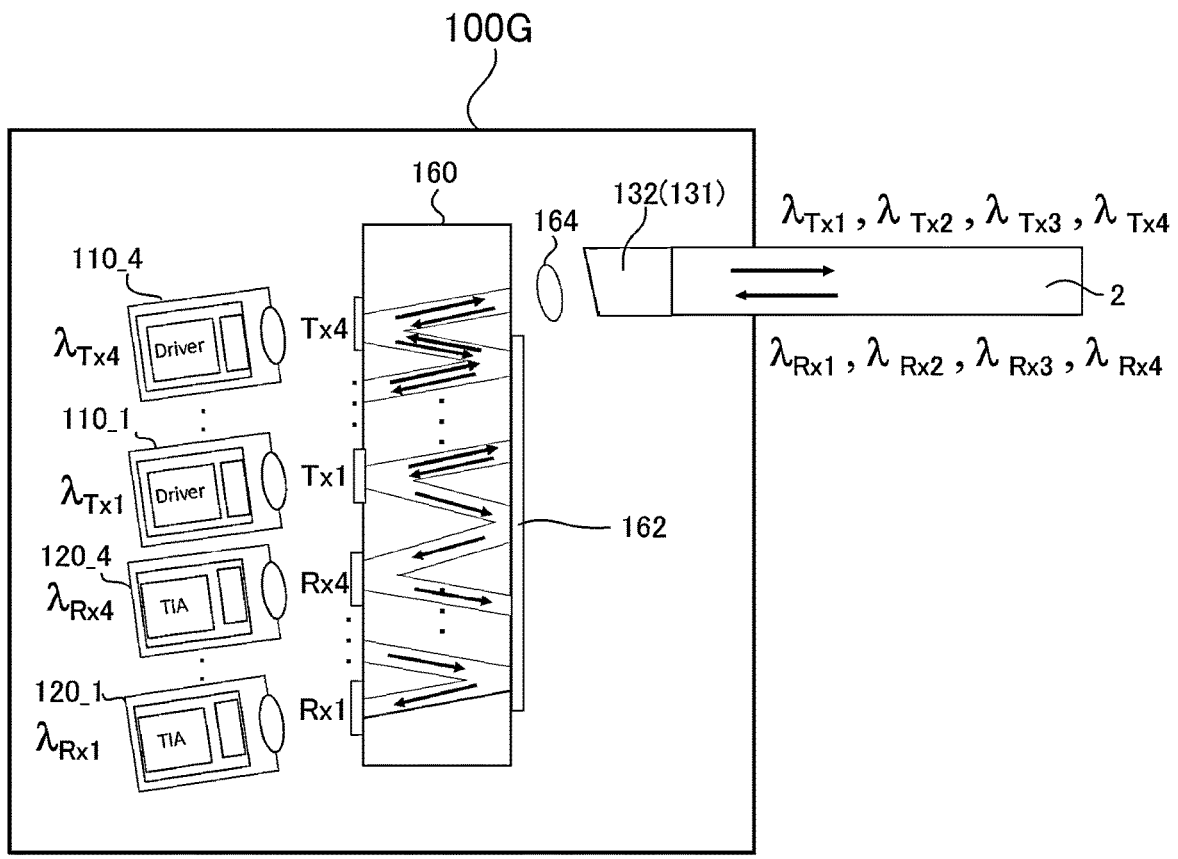
FIG. 13 is a diagram showing an optical transceiver according to an example 5.
Figure 14:
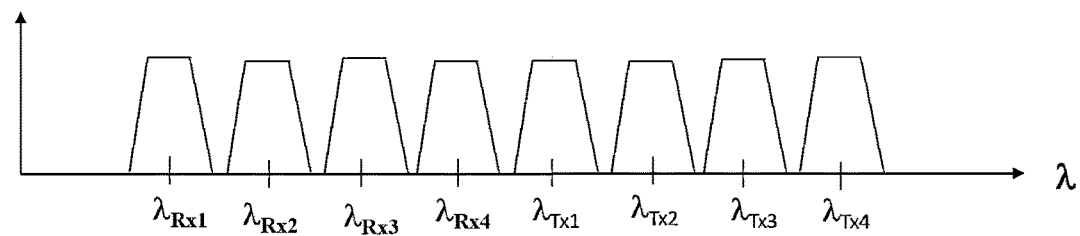
FIG. 14 is a diagram showing the wavelengths to be used in the optical transceiver shown in FIG. 13.

FIG. 13 a diagram showing an optical transceiver 100G according to an example 5. FIG. 14 is a diagram showing the wavelengths to be used in the optical transceiver 100G shown in FIG. 13. The optical transceiver 100G is a transceiver configured as a bidirectional transceiver using four transmission wavelengths and four reception wavelengths in the T band. As shown in FIG. 14, wavelength division multiplexing transmission is performed using eight wavelengths ($\lambda_{RX1}$, $\lambda_{RX2}$, $\lambda_{RX3}$, $\lambda_{RX4}$, $\lambda_{TX1}$, $\lambda_{TX2}$, $\lambda_{TX3}$, $\lambda_{TX4}$) in the T band (1.1 μm to 1.2 μm). The wavelengths are designed with wavelength intervals on the order of 0.02 μm. Such an arrangement employs a wavelength division multiplexing technique, which is so-called coarse wavelength division multiplexing (CWDM), in which the wavelength intervals are relatively large, having an advantage that each wavelength is included within the transmission band (having a width of approximately 0.013 μm) of each bandpass filter without wavelength control using temperature control of the semiconductor laser. CWDM also has other advantages. That is to say, CWDM allows an optical band-pass filter, which performs combination and splitting of each wavelength, to be provided using a dielectric multilayer film with a low cost in a simple manner.

The optical transceiver 100G includes multiple transmitters 110_1 to 110_4, multiple receivers 120_1 to 120_4, an optical component 160, a total reflection film 162, a lens 164, and wavelength filters Tx1 to Tx4 and Rx1 to Rx4.

The wavelength filters $Rx_\#$ and $Tx_\#$ (#=1 to 4) transmit only wavelengths $\lambda_{RX\#}$ and $\lambda_{TX\#}$. The other seven wavelengths are reflected.

In order to provide wave combination and wave splitting of the four transmission wavelengths and four reception wavelengths, for example, wavelength filters Tx1 to Tx4 and Rx1 to Rx4 are attached to the optical component 160 formed of optical glass that is transparent to T-band light. In the drawing, the total reflection film 162 is attached to a part of the optical component 160 opposite to the transmitters 110 and the receivers 120. Furthermore, the wavelength filters Tx# and Rx# that correspond to the respective wavelengths are attached to the optical component 160 on the side of the transmitters 110_# and the receivers 120_#. The four-wave reception signal is input to the optical component 160 via the lens 164 or the like after it is transmitted via the mode filter 132 butt-coupled to the single-mode fiber 2. Subsequently, the input light propagates obliquely downward in the drawing. The received light is totally reflected by the wavelength filters Tx and is further reflected and returned back by the total reflection film. When the received light reaches the wavelength filter Rx4 after such reflection is repeated, only wavelength $\lambda_{RX4}$ of the received light is transmitted by the wavelength filter Rx4, and wavelength $\lambda_{RX4}$ is received by the receiver 120_4. With the configuration shown in this drawing, subsequently, the wavelength filter Rx3 splits wavelength $\lambda_{RX3}$ of the received light. Subsequently, $\lambda_{RX1}$ and $\lambda_{RX1}$ are received in this order. It should be noted that, in the stage of the last wavelength filter Rx1, the remaining wavelength is only $\lambda_{RX1}$. Accordingly, ideally, the last wavelength filter Rx1 is not required. However, in practice, each wavelength filter does not have perfect splitting characteristics, leading to a small amount of light of different wavelengths remaining. In this case, the last wavelength filter Rx may preferably not be omitted and be provided in order to remove the different wavelength components.

Transmission light, e.g., the signal light $\lambda_{TX1}$ output from the transmitter, couples with the optical component 160 via the wavelength filter Tx1 using a lens or the like. The total reflection film 162 is attached to the opposite side of the optical component 160. Accordingly, the light is returned back, and propagates through the optical component 160 via a reverse path. Subsequently, finally, after the light couples with the single-mode fiber 2, the light is transmitted. In the drawing, a typical example configuration is shown. It can be easily understood that, for example, by changing the attaching positions of the filters, this allows the positions of the transmitters and receivers to be swapped.

Description has been made in the embodiment and several examples and modifications regarding an arrangement in which the planar lightwave circuit 131 has a function as a mode filter. However, the present invention is not restricted to such an arrangement. Also, in order to provide a function as a mode filter, a part of the optical fiber 2 may be intentionally bent before it is arranged.

The embodiments show only the mechanisms and applications of the present invention. Rather, various modifications and various changes in the layout can be made without departing from the spirit and scope of the present invention defined in appended claims.

The invention claimed is:

1. An optical transceiver structured to be capable of providing bidirectional communication with another optical transceiver that is a communications partner via a single-mode optical fiber, the optical transceiver comprising:
    a surface emitting laser employed as a transmitter structured to oscillate at a transmission wavelength in the T-band that is shorter than a cutoff wavelength of the optical fiber;
    a photodetector employed as a receiver having a detection sensitivity with respect to a reception wavelength that is shorter than the transmission wavelength in the T band;
    a forward monitor element structed to detect an output intensity of the surface emitting laser;
    a low-pass filter structured to transmit the reception wavelength, and to reflect the transmission wavelength;
    a partial reflecting mirror structured to transmit a part of the transmission wavelength, and to reflect a remaining part thereof; and
    a planar lightwave circuit coupled to the optical fiber, the surface emitting laser, the photodetector, and the forward monitor element,
    wherein the planar lightwave circuit is structured in a rectangular shape having a first side and a second side that are opposite to each other,
    wherein the optical fiber and the forward monitor element are coupled to the planar lightwave circuit via the first side,
    wherein the partial reflecting mirror is inserted between the forward monitor element and the planar lightwave circuit,
    wherein the photodetector and the surface emitting laser are coupled to the planar lightwave circuit via the second side,
    wherein the low-pass filter is inserted between the photodetector and the planar lightwave circuit,
    and wherein the planar lightwave circuit comprises:
        a first path structured to couple a connection position of the optical fiber on the first side and a connection position of the photodetector on the second side; and
        a second path structured to couple a connection position of the photodetector on the second side and a connection position of the surface emitting laser on the second side via a connection position of the forward monitor element on the first side.

2. An optical transceiver structured to be capable of providing bidirectional communication with another optical transceiver that is a communications partner via a single-mode optical fiber, the optical transceiver comprising:
- a surface emitting laser employed as a transmitter structured to oscillate at a transmission wavelength in the T band that is shorter than a cutoff wavelength of the optical fiber;
- a photodetector employed as a receiver having a detection sensitivity with respect to a reception wavelength that is longer than the transmission wavelength in the T band;
- a forward monitor element structured to detect an output intensity of the surface emitting laser;
- a high-pass filter structured to transmit the reception wavelength, and to reflect the transmission wavelength;
- a partial reflecting mirror structured to transmit a part of the transmission wavelength, and to reflect a remaining part thereof; and
- a planar lightwave circuit coupled to the optical fiber, the surface emitting laser, the photodetector, and the forward monitor element,
- wherein the planar lightwave circuit is structured in a rectangular shape having a first side and a second side that are opposite to each other,
- wherein the optical fiber and the forward monitor element are coupled to the planar lightwave circuit via the first side,
- wherein the partial reflecting mirror is inserted between the forward monitor element and the planar lightwave circuit,
- wherein the photodetector and the surface emitting laser are coupled to the planar lightwave circuit via the second side,
- wherein the high-pass filter is inserted between the photodetector and the planar lightwave circuit,
- and wherein the planar lightwave circuit comprises:
  - a first path structured to couple a connection position of the optical fiber on the first side and a connection position of the photodetector on the second side; and
  - a second path structured to couple a connection position of the photodetector on the second side and a connection position of the surface emitting laser on the second side via a connection position of the forward monitor element on the first side.

3. The optical transceiver according to claim 1, wherein the planer lightwave circuit comprises a mode filter structured to remove a higher-order mode from a reception light signal input via the optical fiber, and to supply the reception light signal to the photodetector.

4. The optical transceiver according to claim 1, comprising no isolator structured to remove return light to the surface emitting laser.

5. The optical transceiver according to claim 2, comprising no isolator structured to remove return light to the surface emitting laser.

6. The optical transceiver according to claim 1, wherein an output face of the surface emitting laser is attached to an edge of the planar lightwave circuit.

7. The optical transceiver according to claim 2, wherein an output face of the surface emitting laser is attached to an edge of the planar lightwave circuit.

8. The optical transceiver according to claim 1, wherein the first path has a function as a mode filter for removing a higher-order mode of the reception light signal.

9. The optical transceiver according to claim 2, wherein the first path has a function as a mode filter for removing a higher-order mode of the reception light signal.

10. The optical transceiver according to claim 8, wherein the first path has a radius of curvature designed so as to remove the higher-order mode of the reception light signal.

11. The optical transceiver to claim 9, wherein the first path has a radius of curvature designed so as to remove the higher-order mode of the reception light signal.

12. The optical transceiver according to claim 1 wherein the second path has a function as a mode filter for removing the higher-order mode of the transmission light signal.

13. The optical transceiver according to claim 2, wherein the second path has a function as a mode filter for removing a higher-order mode of the transmission light signal.

14. The optical transceiver according to claim 12, wherein the second path has a radius of curvature designed so as to emit the higher-order mode of the transmission light signal.

15. The optical transceiver according to claim 13, wherein the the second path has a radius of curvature designed so as to emit the higher-order mode of the transmission light signal.

16. The optical transceiver structured to be capable of providing bidirectional communication with another optical transceiver that is a communications partner via a single-mode optical fiber, the optical transceiver comprising:
- a surface emitting laser employed as a transmitter structured to oscillate at a transmission wavelength in the T band that is shorter than a cutoff wavelength of the optical fiber;
- a photodetector employed as a receiver having a detection sensitivity with respect to a reception wavelength in the T band; and
- a planar lightwave circuit structured to couple the optical fiber, the surface emitting laser, and the photodetector,
- wherein the planar lightwave circuit comprises a four-port directional coupler,
- wherein the optical fiber is coupled to one from among two ports on a primary side of the directional coupler,
- wherein the photodetector and the surface emitting laser are coupled to two ports on a secondary side of the directional coupler,
- and wherein the directional coupler has a function as a mode filter for removing a higher-order mode of the reception light signal, and to supply a fundamental mode of the reception light signal to the photodetector.

17. The optical transceiver according to claim 16, further comprising a forward monitor element coupled to the other of the two ports on the primary side of the directional coupler and structured to detect an output intensity of the surface emitting laser.

* * * * *